United States Patent [19]
MacKenzie et al.

[11] Patent Number: 5,459,630
[45] Date of Patent: Oct. 17, 1995

[54] SELF TESTING CIRCUIT BREAKER GROUND FAULT AND SPUTTERING ARC TRIP UNIT

[75] Inventors: Raymond W. MacKenzie, Baldwin Borough; John A. Wafer, Brighton Township, both of Pa.

[73] Assignee: Eaton Corporation, Cleveland, Ohio

[21] Appl. No.: 121,708

[22] Filed: Sep. 15, 1993

[51] Int. Cl.⁶ .................................................. H02H 3/16
[52] U.S. Cl. .................. 361/45; 361/49; 361/113; 324/520
[58] Field of Search ................. 361/45, 47, 49, 361/86, 94, 113, 87; 324/510, 509, 514, 520, 522, 523, 527, 541, 544; 340/650, 651

[56] References Cited

U.S. PATENT DOCUMENTS

| | | | |
|---|---|---|---|
| 4,618,907 | 10/1986 | Leopold | 361/45 |
| 4,833,564 | 5/1989 | Pardue et al. | 361/93 |
| 5,177,657 | 1/1993 | Baer et al. | 361/45 |
| 5,224,006 | 6/1993 | MacKenzie et al. | 361/45 |
| 5,307,230 | 4/1994 | MacKenzie | 361/96 |

*Primary Examiner*—Todd DeBoer
*Attorney, Agent, or Firm*—Martin J. Moran

[57] ABSTRACT

Ground fault trip units for circuit breakers are tested by a passive test circuit which includes a test conductor passing through the current transformer sensing coil(s), and a test switch which selectively connects the test conductor in a loop which simulates a neutral-to-ground fault. In a dormant oscillator ground fault test circuit, the test conductor loop passes through both sensing coils. When the neutral-to-ground detector is combined with a sputtering arc fault detector sharing a common sensing coil, testing of all the components is accomplished by adding an additional test circuit which injects pulses derived from the line conductor into the sensing coil secondary, or which alternatively, connects a capacitor charged from a DC supply across the sensing coil secondary. Either of these alternative test circuits generates the successive events needed to produce a sputtering arc trip.

23 Claims, 5 Drawing Sheets

SELF TESTING CIRCUIT BREAKER GROUND FAULT AND SPUTTERING ARC TRIP UNIT

BACKGROUND OF THE INVENTION

1. Field of the Invention

This invention relates to electronic trip units for circuit breakers, and more particularly to such trip units which respond to ground faults and sputtering arc faults, and incorporate test circuits for fully testing these features.

2. Background Information

Conventional residential and light industrial and commercial circuit breakers have a thermal trip device which responds to persistent overcurrents of moderate magnitude to provide a delayed trip, and a magnetic trip device which responds instantaneously to overcurrents of large magnitudes. Thus, the fault current must reach a pre-determined magnitude, for example, ten times rated current for the instantaneous trip to occur, or the overcurrent must sustain a predetermined average value over a given time interval to implement the delayed trip.

Recently, it has become common to incorporate ground fault trip units into such circuit breakers. The ground fault trip unit detects faults between the line conductor and ground and the neutral conductor and ground. Line-to-ground faults are commonly detected by a differential transformer in the form of a toroidal coil. The line and neutral conductors are passed through the coil so that in the absence of a line-to-ground fault, the currents are equal and opposite and no signal is generated in the secondary. A line-to-ground fault causes a sizeable imbalance in the currents in the two conductors which can be level detected. The neutral conductor is required by code to be grounded near the circuit breaker. Thus, a neutral-to-ground fault in the protected system closes a loop between the neutral conductor and ground. Typically, neutral-to-ground faults are detected by injecting a signal onto the neutral conductor which produces an oscillation if feedback is provided through the loop completed by the neutral-to-ground fault.

A common type of ground fault detector is the dormant oscillator circuit. This ground fault circuit includes two sensing coils. The first serves as a differential transformer which detects line-to-ground faults. A neutral-to-ground fault couples the two coils to provide feedback which causes an operational amplifier to oscillate.

It is common for ground fault circuit breakers to incorporate test circuits for testing the line-to-ground fault portion of the circuit. Typically, this includes a test lead which passes through the differential transformer coil and is selectively connected by a switch across the line and neutral conductors. To our knowledge, no arrangement is currently provided for testing for neutral-to-ground faults.

Recently, there has been interest in protecting electrical systems from sputtering arc faults. Sputtering arc faults occur when bare or stripped conductors come into contact. The current caused by such a fault produces magnetic repulsion forces which push the conductors apart, thereby striking an arc. The arc is extinguished as the current passes through zero. Mechanical or electro-static forces bring the conductors back into contact, and the cycle is repeated. The arc that is caused by these faults can melt the copper in the conductors, especially in stranded wire conductors such as extension cords, which can ignite surrounding materials. Although such faults present a fire hazard, the currents are typically not high enough to be detected by the thermal or magnetic trip devices.

Commonly owned U.S. Pat. No. 5,224,006 discloses a circuit breaker with an electronic trip unit which responds to sputtering arc faults. This trip unit is based on a recognition that the sputtering arc fault creates a step current wave form in contrast to the sinusoidal wave forms created by bolted faults and overload currents. Thus, the trip unit generates a bandwidth limited di/dt signal which is level detected so that sputtering arc faults with peak currents below the pick-up levels of the thermal and magnetic trip devices will trip the circuit breaker.

The sputtering arc fault detector of U.S. Pat. No. 5,224,006 utilizes the sensing coil of a dormant oscillator ground fault detector, which provides the feedback for neutral-to-ground fault detection, to generate the di/dt signal.

Commonly owned patent application Ser. No. 023,435 entitled "Circuit Breaker Responsive to Repeated In-Rush Currents Produced by a Sputtering Arc Fault" filed on Feb. 26, 1993, in the names of Raymond W. Mackenzie and Joseph C. Engel and identified as assignee's case WE 57,406 addresses the problem that the arcing wave form characterized by fast turn on to high values of current produced by sputtering arc faults is also produced by some appliances, or groups of appliances switched on simultaneously. While the magnitude of the inrush currents produced by these appliances is not as large as the currents produced by a sputtering arc fault, and thus false trips can be avoided by an appropriate setting of the level detector, this latter patent application provides discrimination between sputtering arc faults and appliance in-rush currents by recognizing that the latter are singular events while a sputtering arc fault makes and breaks repeatedly. Accordingly, the trip unit of this patent application counts the number of times that the di/dt signal exceeds the threshold within a given time interval.

The trip units described in the above patent applications both include the previously described test circuit which only tests the line-to-ground trip function. They do not test the neutral-to-ground detector or the sputtering arc detector.

There is a need there for an improved electronic trip unit which provides a complete test for ground faults, including neutral-to-ground faults, and for testing of the sputtering arc fault detector.

SUMMARY OF THE INVENTION

This need and others are satisfied by the invention which is directed to self-testing trip units which provide a test of the neutral-to-ground fault detection function as well as the line-to-ground fault detection function. In addition, the self-testing trip unit of the invention provides for testing of the sputtering arc detection function of the trip unit. Thus, all of the trip functions of the electronic trip unit are fully tested.

More specifically, for testing the neutral-to-ground function of the trip unit, passive test means comprise a test conductor which passes through the current sensing coil and a switch which selectively connects the test conductor in a loop passing through the sensing coil. Closing of the test switch simulates a neutral-to-ground fault. In the case of the dormant oscillator ground fault detector, the test conductor passes through both of the sensing coils to provide the coupling between coils when the switch is closed. As the entire dormant oscillator circuit, including both sensing coils, must be operative to detect the neutral-to-ground fault, this simple passive test device is a full test of the dormant oscillator ground fault detector.

In the sputtering arc fault detector, where means are connected to the secondary of the current sensing coil to generate a bandwidth limited di/dt signal which is then level detected, test signals are injected into the secondary side of the sensing coil, as it is difficult to generate the magnitude of the signals required on the primary side of the coil. However, where the sputtering arc detector is combined with and uses the current sensing coil of the ground fault detector, the ground fault test provides a test of the coil.

The means for injecting the test signal for testing a sputtering arc fault detector, includes in a first embodiment, an impedance connected to the secondary of the current sensing coil, and a switch which selectively connects the impedance to the line conductor. Where the sputtering arc detector includes means which count the number of times that the bandwidth limited di/dt signal exceeds the threshold, the half cycles of the AC from the line conductor provide the repetitive events needed to test the detector.

An alternative arrangement for injecting test signals into the sputtering arc fault detector, includes a capacitor connected to the secondary of the current sensing coil and means for charging the capacitor. A switch selectively discharges the capacitor into the secondary winding of the sensing coil which produces an oscillation of sufficient magnitude to cause the bandwidth limited di/dt signal to exceed the threshold level the required number of times within the selected time interval. In the alternative method of sensing sputtering arc faults which employs measurement of the voltage drop across the resistivity of the neutral conductor, and which passes the signal thus obtained through a low-pass falter and a high-pass filter, as described in patent application Ser. No. 023,435 referenced above, the test signal may be injected into the output of the first falter section by means of an impedance connected thereto, and by means of a test switch to connect said impedance to the line conductor.

BRIEF DESCRIPTION OF THE DRAWINGS

The accompanying drawings, which are incorporated in and form part of the specification, illustrate several embodiments of the present invention, and together with the description, serve to explain the principals of the invention.

DESCRIPTION OF THE PREFERRED EMBODIMENTS

The invention will be described as applied to a conventional residential circuit breaker such as that described in U.S. Pat. No. 4,081,852 which is herein incorporated by reference. That circuit breaker includes a thermo-magnetic overcurrent trip mechanism and a ground fault detector mounted in side-by-side compartments within a molded housing. The ground fault detector includes a trip solenoid having a plunger which extends through the wall between the two compartments in the molded housing to actuate the thermo-magnetic trip mechanism to trip the circuit breaker in response to a ground fault.

Figure 1:
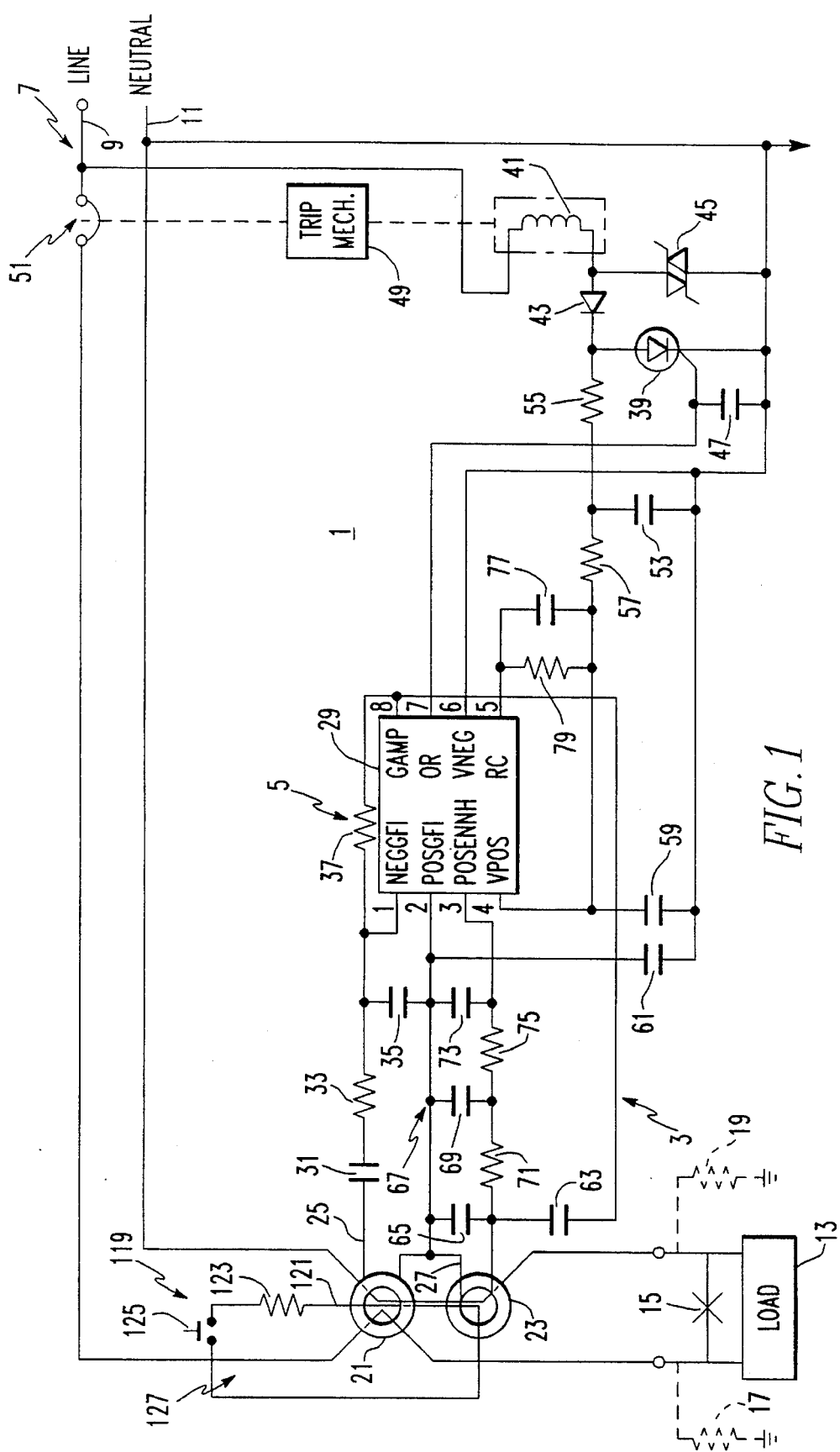
FIG. 1 is a schematic diagram of a sputtering arc fault circuit breaker combined with, and sharing a sensing coil with, a ground fault detection circuit, and including one embodiment of a test circuit in accordance with the invention.

As shown in FIG. 1, the circuit breaker 1 of the invention, in its preferred embodiment, combines a sputtering arc detector 3 with a ground fault detector 5. The circuit breaker 1 protects an electric system 7 which includes a line conductor 9 and a neutral conductor 11 which provide electric power to a load 13. In addition to protecting against typical overcurrents drawn by the load 13 and bolted line-to-neutral faults, the circuit breaker 1 of the invention protects against sputtering arc faults 15 between the line conductor 9 and a neutral conductor 11, and line-to-ground faults 17 and neutral-to-ground faults 19. As discussed above, the sputtering arc fault 15 results when bared sections of the line and neutral conductors come in contact due to, for instance, worn or stripped insulation. Faults in the electrical system 7 are detected by the circuit breaker 1 by current sensors in the form of current sensing transformers 21 and 23. These current sensing transformers 21 and 23 are toroidal coils. The line conductor 9 and neutral conductor 11 are passed through the opening in the toroidal coil 21 to form the primary of that current transformer. The current transformer 23 has a single primary in the form of the neutral conductor 11 which passes through the opening of the toroidal coil. The second winding 25 of the current transformer 21 and the second winding 27 of the current transformer 23 are each connected to an integrated circuit 29.

The current transformer 21 detects line-to-ground faults. With no line-to-ground fault on the electrical system 7, the currents through the line and neutral conductors 9, 11 which form the primaries of the transformer will be equal and opposite so that no current will be induced in the secondary winding 25. If the line conductor 9 is grounded, there will be a large current through this conductor and little or no current through the neutral conductor 11 so that a sizable current will be induced in the secondary winding 25. This signal is applied to the integrated circuit (IC) 29 through the NEGGFI and POSGFI inputs through a DC blocking capacitor 31 so that offsets in an op amp (to be described) in the IC are not applied to the current transformer 21. A resistor 33 critically dampens resonance caused by the series connected capacitor 31 and secondary winding 25 of the current transformer 21. A capacitor 35 across the IC inputs provides noise suppression. A feedback resistor 37 sets the gain for the op amp in the IC 29.

As will be discussed in more detail below, if the magnitude of the current in the secondary winding 25 of the current transformer 21 exceeds a threshold selected to detect a line-to-ground fault, the OR output on the IC 29 goes high to turn on an SCR 39. Turning on of the SCR 39 provides current for energization of a trip solenoid 41 with current drawn from the line and neutral conductors. This current is half wave rectified by the diode 43. The SCR 39 is protected from surges by the metal oxide varistor (MOV) 45 and from noise on the gate by capacitor 47. Energization of the trip solenoid 41 actuates the trip mechanism 49 as described in U.S. Pat. No. 4,081,852 to open contacts 51 in the line conductor 9.

The diode 43 also provides DC power to a shunt regulator in the IC 29. The current drawn by the IC is insufficient to actuate the trip solenoid 41. The power supply for the IC 29 includes a filter capacitor 53, and a pair of resistors 55 and 57 which determine the current level of the supply. This DC power is provided to the VPOS input of the IC 29. The VNEG pin is connected to the ground for the neutral conductor. A bypass capacitor 59 assures that there is no ac on the VPOS input. Similarly, another bypass capacitor 61 eliminates ac on the POSGFI input.

The ground fault detector 5 is of the dormant oscillator type. The secondary winding 27 of the current transformer 23 is also connected to the output of the op amp in the IC 29 at pin GAMP through a coupling capacitor 63. Neutral-to-ground faults couple the secondary windings 25 and 27 though the current sensing transformers 21 and 23 to form a feedback loop around the IC 29 causing the op amp in the IC to oscillate. The frequency of this oscillation can be set by the selection of the value of the capacitor 63 and the capacitor 65 as well as the parameters of the current sensing transfomrers 21 and 23. In the exemplary circuit breaker, this frequency is about 20 KHz. When the magnitude of the oscillation exceeds selected thresholds, the SCR 39 is fired to trip the circuit breaker.

In accordance with the invention, the current sensing transformer 23 is also used to sense current for detecting sputtering arc faults. The rate of change of current signal, di/dt, needed for sputtering arc fault detection, is generated by providing a core in the current sensing transformer 23 which does not saturate at the current level required to produce a trip. A suitable material for the core is powdered iron which has a low mu and a high flux saturation level. Such a core only affects the neutral ground detection by increasing the frequency of oscillation by a small amount.

The di/dt signal produced on the secondary winding 27 of the current sensing transformer 23 is bandwidth limited by passing it through a low pass filter 67. This is a two pole low pass falter with the first pole formed by the capacitor 69 and resistor 71, and the second pole formed by the capacitor 73 and resistor 75. This low pass falter 67 in the exemplary circuit breaker has a half-power point at about 2 KHz. As discussed in the above referenced patent application, the di/dt signal can be used to provide an indication of overcurrent, line-to-neutral faults and sputtering arc faults. The parameters of the bandwidth limiting low pass filter 67 are selected to attenuate the spikes in the di/dt signal caused by a sputtering arc fault, and to regulate the relative sensitivity of the circuit to the sinusoidal currents of the overcurrent line-to-neutral faults and step functions of the sputtering arc faults. As also discussed above, the present invention distinguishes sputtering arc faults from the in-rush currents caused by some appliances by counting the number of step functions detected within a predetermined time period. A capacitor 77 and resistor 79 set the selected time interval in the manner to be discussed below.

Figure 2:
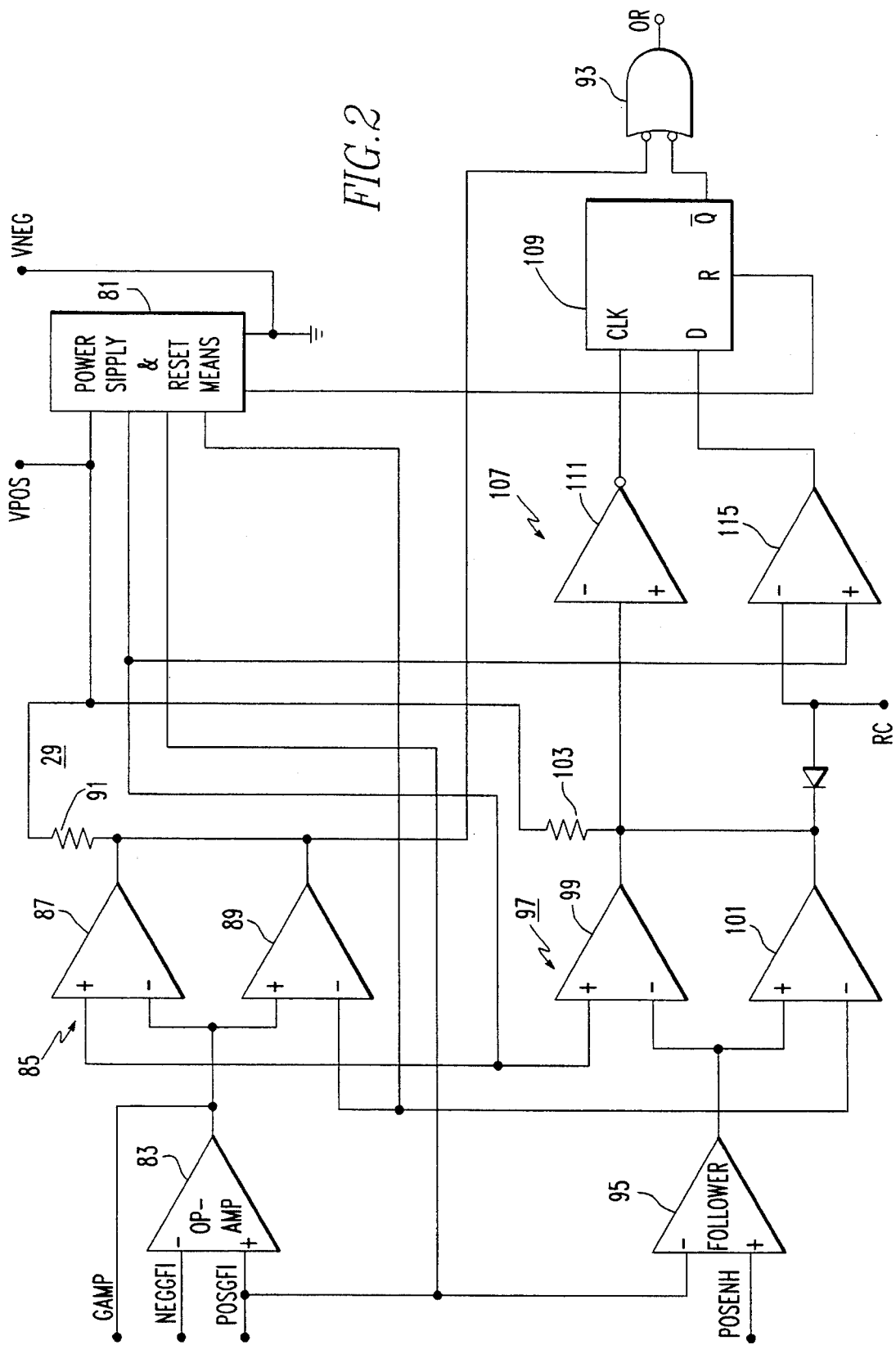
FIG. 2 is a schematic circuit diagram of an integrated circuit which forms part of the circuit of FIG. 1.

FIG. 2 is a schematic circuit diagram of the IC 29. The chip 29 has a power supply 81 which is energized by the half wave rectified supply described above through the VPOS and VNEG pins. An op amp 83 amplifies the signal on the secondary of the current sensing transformer 21 for application to a window comparator 85 comprising the comparators 87 and 89. The comparator 87 is biased by a reference voltage provided by the power supply 81 which is the positive threshold for detecting line-to-ground faults. Similarly, a negative threshold bias voltage is applied to the comparator 89. A bias voltage, which is roughly the midpoint of the power supply voltage, is applied to the noninverting input of the op amp 83. A pull-up resistor 91 is connected between the outputs of the comparators 87 and 89 and VPOS. The output of these comparators is also connected to an inverting input of an OR circuit 93, the output of which is connected to the gate of the SCR 39 through the OR pin of the IC 29. Normally, the outputs of the comparators 87 and 89 are high so that the SCR 39 is not gated. The presence of a line-to-ground fault causes a signal generated on the secondary winding 25 of the current sensing transformer 21 to exceed the thresholds applied to the comparators 87 and 89 during alternate half cycles of the load current. Positive half cycles of the ground fault current cause the output of comparator 87 to go low so that the output of the OR circuit 93 goes high to gate the SCR 39 and energize the trip solenoid 41. On negative half cycles, the comparator 89 turns on the SCR 39.

As previously discussed, for neutral-to-ground faults, the second current sensing transformer 23 is connected to the output of the op amp 83 through coupling capacitor 63 connected to the GAMP pin of the IC 29. Any neutral-to-ground fault completes a feedback loop between the current sensing transfomrer 23 connected to the output of the op amp 83 and the current sensing transformer 21 connected to the input. When the magnitude of this oscillation exceeds the thresholds of the window comparator 85, the SCR 39 is gated through the OR 93.

As mentioned, the current sensing transfomrer 23 is also used to detect sputtering arc faults. The di/dt signal generated on the secondary winding 27, which is bandwidth limited by the low pass filter 67, is applied through a follower op amp 95 to a second window comparator 97 comprising the comparators 99 and 101. The comparators 99 and 101 compare the bandwidth limited di/dt signal to positive and negative thresholds set by the power supply 81. A pull-up resistor 103 connected to VPOS maintains a high logic signal at the outputs of the comparators 99 and 101 when the bandwidth limited di/dt signal is within the selected limits. When a current wave form representative of a sputtering arc fault is detected, the output of the window comparator 97 goes low. As certain appliances can generate a similar wave form, albeit typically of lower magnitude, a counter circuit 107 is provided on the output of the window comparator 97. The counter circuit 107 counts events in which the thresholds of the window comparator 97 are exceeded. In the preferred embodiment of the invention, the counting circuit 107 generates a trip signal upon the occurrence of two such events within the selected time interval.

The counter circuit 107 includes a D flip-flop 109. The flip-flop 109 is clocked by the output of the window comparator 97 through an inverter 111. The output of the window comparator 97 is also connected through a diode 113 to the inverting input of a comparator 115. This comparator 115 compares the output of the window comparator 97 with the positive threshold voltage generated by the power supply 81. Typically, this reference voltage is about three-quarters of the power supply voltage. The output of the comparator 115 is applied to the data input D of the flip-flop 109. The Q output of the flip-flop 109, which is not used in the circuit of FIG. 2, goes to the logic value of the signal at the D terminal when a clock pulse is applied to the CLK input. Thus, the Q̄ output of the flip-flop goes to the logical opposite of the signal applied to the D input when the flip-flop is clocked. The Q̄ is connected to an inverting input of the OR 93.

The inverting input of the comparator 115 is also connected through the RC pin of the IC 29 to the timing capacitor 77 (see FIG. 1). The other side of the capacitor 77 is connected to VPOS. Under normal circumstances, the capacitor 77 is discharged by the shunt resistor 79. Therefore, the output of the comparator 115 is low. When the output of the window comparator 97 goes low for the first time, indicating a sputtering arc fault event, the flip-flop 109 is clocked by the leading edge of the pulse. As the D input was low at the time of the clock pulse, the Q output remains high, and no gate signal is applied to the SCR 39 through the OR 93. When the output of the window comparator 97 goes low, the capacitor 77 charges rapidly through the diode 113 to approximately VPOS. As the voltage on the noninverting input now exceeds the reference voltage, the output of the comparator 115 goes high. When the output of the window comparator 97 again goes high as the sputtering arc current reaches its peak magnitude, the capacitor 77 begins to discharge through the resistor 79. The values of these components are selected so that the voltage on the capacitor 77 remains above the reference voltage applied to the comparator 115 for the selected time interval. As mentioned, a suitable time interval is about one second. If the output of the window comparator 97 goes low before the timer has timed out, which is indicative of a sputtering arc fault, the D input of the flip-flop 109 will be high when the flip-flop is clocked, and hence the Q̄ output will go low, causing the output of OR 93 to go high and gate the SCR 39 on to energize the trip solenoid 41.

Typically ground fault circuit breakers, including the circuit breakers of the related applications, have an internal test switch which tests the operation of the ground fault electronics by injecting a primary current into the current transformer 21. This only tests the ability of the ground fault circuit breaker to respond to a line-to-ground fault. Operation of the grounded neutral fault detection circuit is not tested. If this circuit fails, and a grounded neutral fault is present, along with a line-to-ground fault, the ground fault circuit breaker may be unable to trip, even though the ground fault circuit breaker trips with the test switch.

The enhanced ground fault circuit breaker 1 described in FIGS. 1 and 2, which also includes sputtering arc protection, further complicates the testing problem. Producing a level of primary current required to test the arc-detection circuit with an internal test switch seems impractical. Further, the arc-detecting circuit 3 utilizes the grounded neutral current transformer 23 for arc sensing, and the line-to-ground fault test does not test the integrity of this current transformer.

In accordance with the invention, a more complete ground fault circuit breaker self-test is achieved by testing the grounded neutral fault detection instead of the line-to-ground fault protection. The grounded neutral fault test requires that the entire electronic circuit be functional in order to trip. The neutral-to-ground test circuit 119 includes test conductor 121 which is passed through, and becomes another primary winding for both of the current transformers 21 and 23. A resistor 123 is connected in series with the test conductor 121 and a test switch 125 which selectively completes a loop 127 passing through the coils of the both of the transformers 21 and 23 when the switch is closed. The resistor 123 has a value substantially equivalent to the maximum impedance of the loop formed by the neutral conductor 11 and ground during a neutral-to-ground fault. Nominally this is about 2 ohms. The test lead 121 can have a distributed resistance equal to this value, thereby eliminating the need for a discrete resistor.

Closing of the test switch 125 completes the loop 127 which simulates a neutral-to-ground fault. As both of the current transformers 21 and 23 must be operative in order for a trip signal to be generated with a neutral-to-ground fault, the entire ground fault detector is tested. The test circuit 119 is simpler than the line-to-ground fault tester, as no power connections are required. Circuit board layout is therefore simplified as there are fewer traces where spacing must be maintained due to the presence of 120 VAC. Assuming that the grounded neutral sensitivity is not initially excessive, a reduction in sensitivity to a line-to-ground fault will also cause the circuit to fail the ground to neutral fault test.

As used with the circuit breaker 1 shown in FIGS. 1 and 2, the grounded neutral fault test circuit 119, tests most of the electronic circuit, including both sensing coils or current transformers 21 and 23, the trip coil 41 the power supply including the components 39, 43–47 and 53–57, most of the custom integrated circuit 29 and all of the passive components except 59–61, and 69–75. Thus, the test circuit 121 improves the likelihood of the sputtering arc detector 3 operating, as the sensing coil, (current transformer 23) used by this detector is included in the test. This may be a sufficient test for the sputtering arc detector, although it does not test 100% of the circuit.

Figure 3:
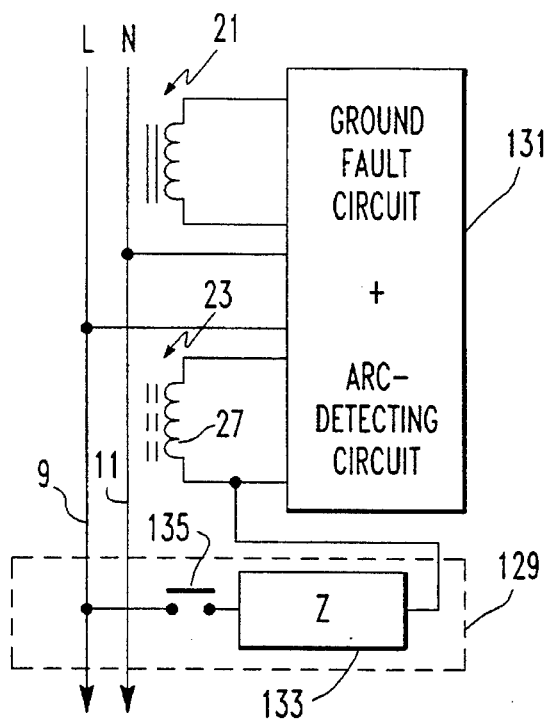
FIG. 3 is a schematic circuit diagram, partially in block diagram form, of an additional test circuit for the circuit breaker of FIGS. 1 and 2.

The entire electronic circuit for the sputtering arc detector 3 can be tested by using a second test circuit 129 shown in FIG. 3. For simplicity, the sputtering arc detector 3 and ground fault detector 5 are shown in block diagram from at 131. This second test circuit 129 includes an impedance 133 connected between the line conductor 9 and the secondary winding 27 of the sensing coil or current transformer 23 on the neutral conductor 11. A switch 135 selectively injects an AC signal into the secondary 27. The impedance 133 may be a resistor, a capacitor or a series combination of resistor and capacitor. The impedance is chosen so that, in conjunction with the circuit impedance, the line voltage is attenuated to a suitable level for testing. Ideally, the attenuation should be adequate to just guarantee a trip at low line voltage. The half cycles of the AC voltage applied by the test circuit 129 provide the events needed by the arc detecting circuit to trip. This test circuit 129 is preferably used in combination with the test circuit 119 so that the entire electronics of the sputtering arc fault detector and the ground fault detector are tested.

Figure 4:
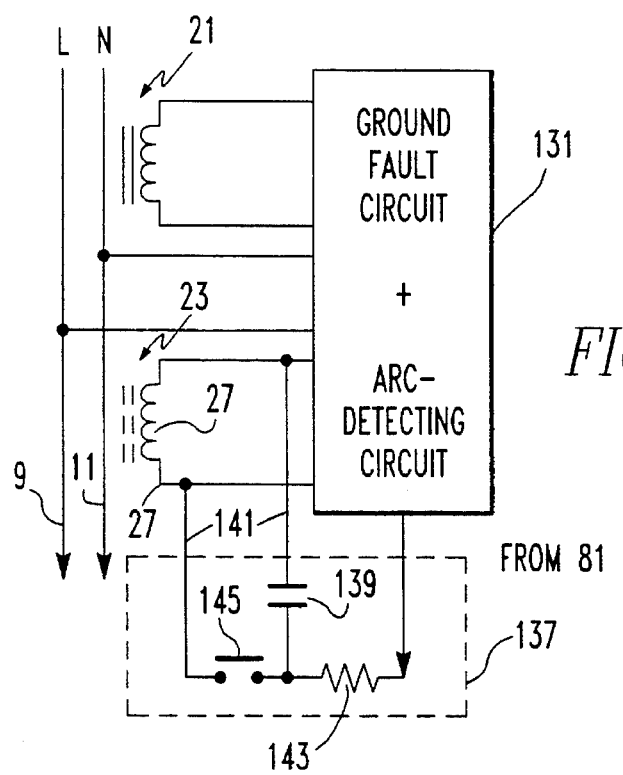
FIG. 4 is a schematic circuit diagram, also partially in block diagram form, of yet another test circuit for the circuit breaker of FIGS. 1 and 2.

An alternate form of the additional test circuit is shown in FIG. 4. This test circuit 137 utilizes DC power derived from the internal power supply 81 to generate the pulses needed to complete the tests of the sputtering arc fault detector. This test circuit 137 includes a capacitor 139 connected by a lead 141 across the secondary winding 27 of the sensing coil or current transformer 23. The capacitor 139 is charged from the DC power supply 81 through a resistor 143. The test switch 145 when closed connects the capacitor 139 across the secondary winding 27 of the sensing coil or current transformer 23. The resonant circuit formed by the winding 27 and capacitor 139 generates the sequence of pulses which trips the sputtering arc fault detector. As the test circuit 137 provides a complete test of the sputtering arc circuit, including the sensing coil 23, this test circuit can be used in conjunction with either the neutral-to-ground test circuit 119, or with the prior art test circuit, which only tests the operation of the line-to-ground fault detection circuit.

Figure 5:
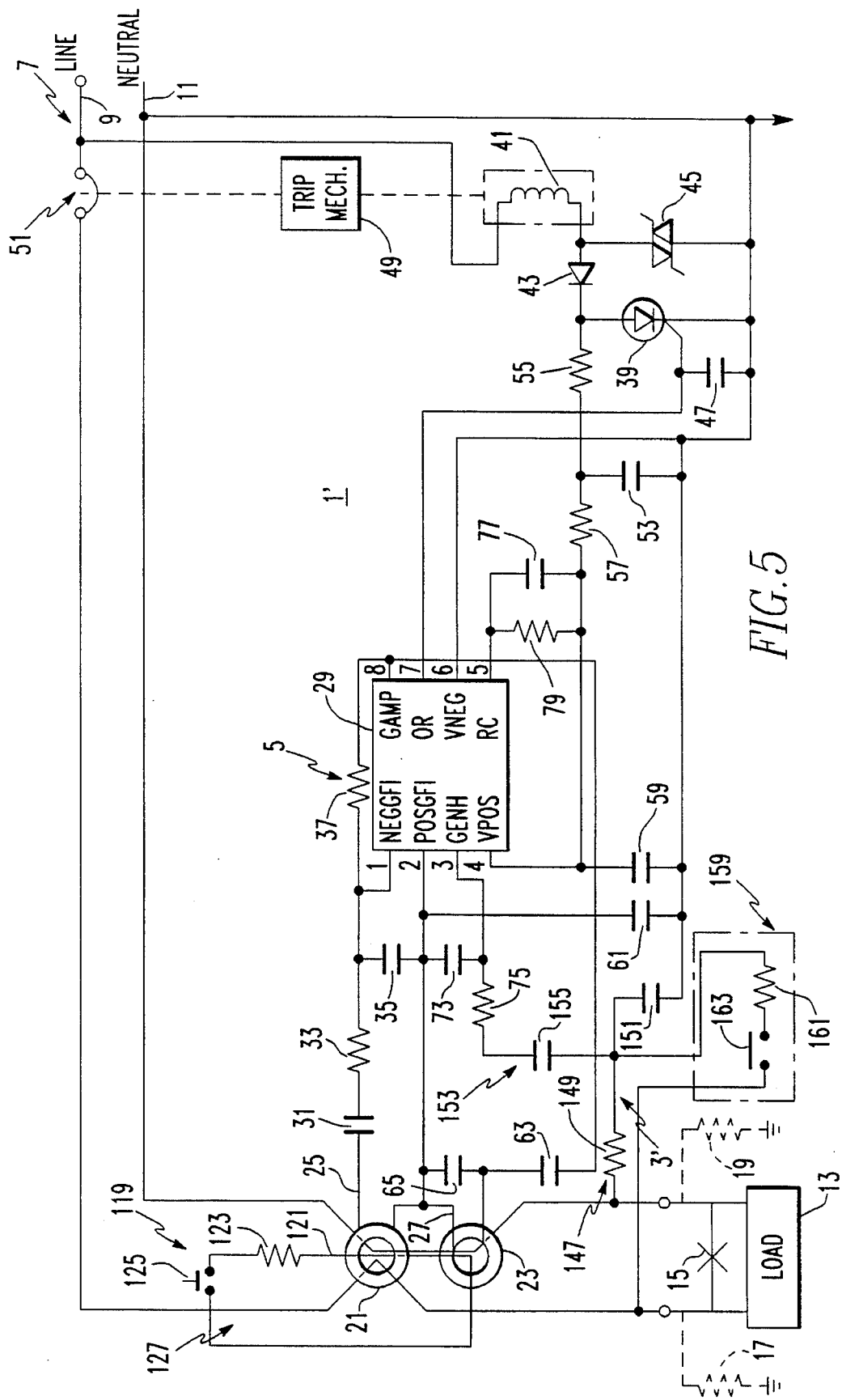
FIG. 5 is a schematic circuit diagram of another sputtering arc fault circuit breaker combined with a ground fault detection circuit which includes a test circuit in accordance with the invention.
Figure 6:
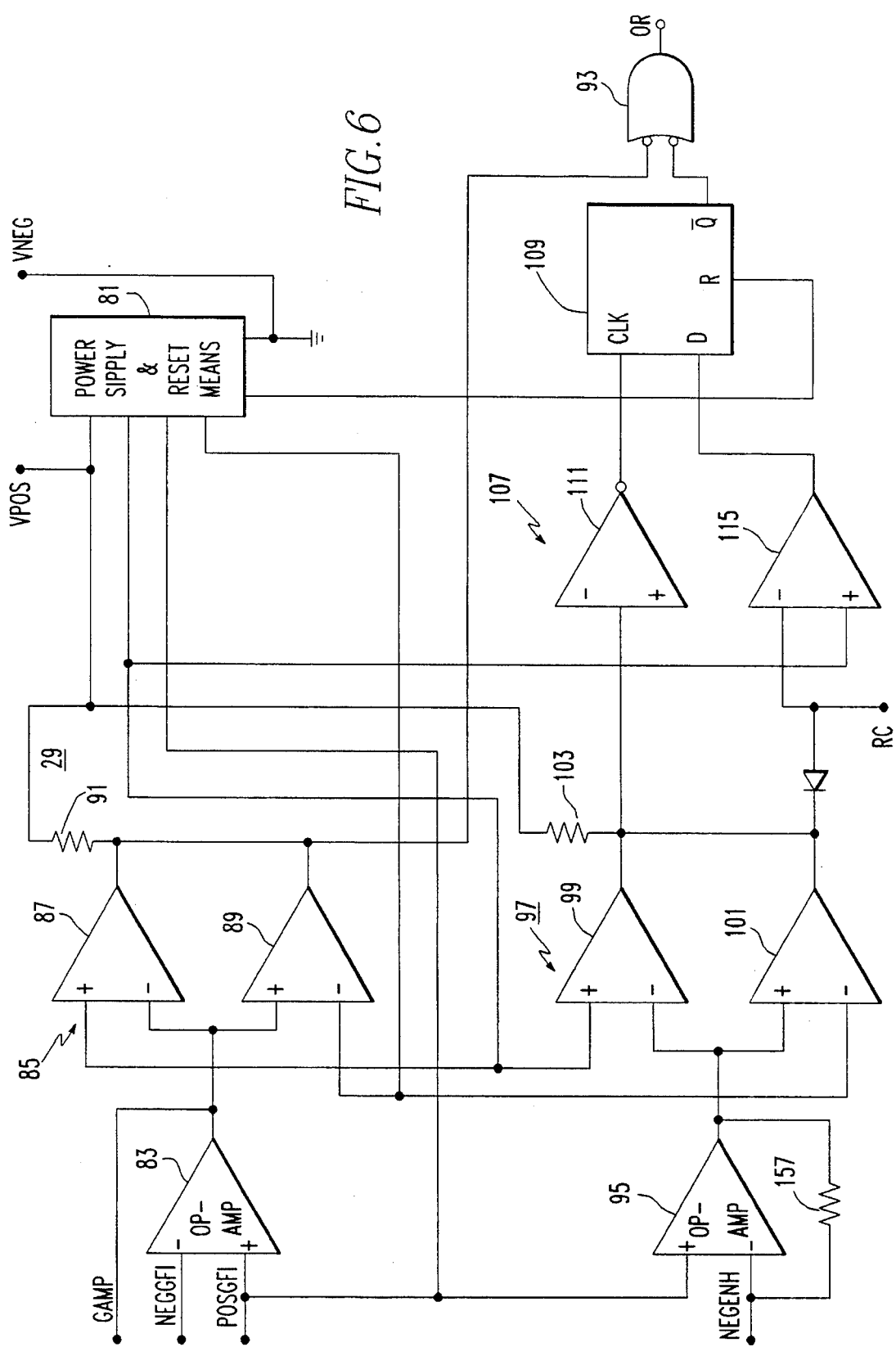
FIG. 6 is a schematic circuit diagram of an integrated circuit which forms part of the circuit breaker of FIG. 5.

FIG. 5 illustrates another embodiment of the invention in which the circuit breaker 1' also responds to both ground faults and sputtering arc faults, but does not use a sensing coil of the ground fault indicator to sense the sputtering arc faults. Instead, the circuit breaker 1' shown in FIG. 5 utilizes the inherent resistivity of the neutral conductor to detect the sputtering arc faults in the manner discussed in U.S. patent application No. 023,435 referred to above. In this modified circuit breaker 1', the resistivity of the neutral conductor 11 generates a voltage which is passed through a low pass filter 147 comprising a resistor 149 and a capacitor 151. The output of this low pass filter is then differentiated by a high pass filter 153 comprising a capacitor 155 and the resistor 75. This combination of a low pass filter 147 followed by a high pass filter 153 produces the same band width limited di/dt signal as the coil circuit of FIG. 1, although at a significantly lower signal level. The band width limited di/dt signal is applied to the inverting input, rather than the non-verting input of the op amp 95 of the integrated circuit 29 as shown in FIG. 6. A feedback resistor 157 provides the gain needed to amplify the very low level detected signal. The remainder of the integrated circuit breaker are the same as in FIG. 1.

The test circuit 159 for testing the sputtering arc portion of the circuit breaker 1' includes an impedance 161 which is connected across the line and neutral conductors in series with the resistor 149 by test switch 163. The resistors 149 and 159 provide a voltage divider which injects a test voltage of the proper magnitude into the sputtering arc detection circuit.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the appended and any and all equivalents thereof.

What is claimed is:

1. A ground fault trip unit for a circuit breaker protecting an electrical system having a line conductor and a grounded neutral conductor comprising:

sensing coil means through which said neutral conductor passes; neutral-to-ground fault detection means connected to said sensing coil means and generating a trip signal for said circuit breaker in response to a neutral-to-ground fault in the protected electrical systems, test means coupled to said sensing coil means simulating a grounded neutral fault condition causing said neutral-to-ground fault detection means to generate said trip signal, said test means comprising a test conductor means extending through said sensing coil means, a test switch for selectively connecting said test conductor means in a closed loop which passes through said sensing coil means, said test conductor means having an impedance substantially equivalent to a maximum impedance of a neutral-to-ground fault in the protected electrical system.

2. The ground fault trip unit of claim 1 wherein said test conductor means comprises an electrical lead and a discrete impedance substantially equivalent to said impedance of said neutral-to-ground fault in the protected electrical system.

3. The ground fault trip unit of claim 1 wherein said test conductor means comprises an electrical conductor having a distributed impedance substantially equivalent to said impedance of said neutral-to-ground fault in the protected electrical system.

4. A trip unit for a circuit breaker in a protected electrical system having a line conductor and a neutral conductor and subject to sputtering arc faults and ground faults, said trip unit comprising: sensing coil means sensing currents in said protected electrical system; fault detector means connected to the sensing coil means for generating a trip signal in response to ground faults including grounded neutral faults and to sputtering arc faults; and test means connected to said sensing coil means selectively injecting signals simulating grounded neutral and sputtering arc fault conditions into said fault detector means.

5. The trip unit of claim 4 wherein said test means comprises a test conductor extending through said sensing coil means, and a test switch for selectively connecting said test conductor in a closed loop extending through said sensing coil means.

6. The trip unit of claim 5 wherein said test conductor means has an impedance substantially equivalent to a maximum impedance of a grounded neutral fault in said protected electrical system.

7. The trip unit of claim 6 wherein said sensing coil means comprises a first sensing coil through which both said line conductor and said neutral conductor pass and a second sensing coil through which said neutral conductor but not said line conductor passes, wherein said fault detection means comprises a dormant oscillator ground fault detector circuit connected to said first and second sensing coils and a sputtering arc detector circuit connected to said second sensing coil, and wherein said test conductor means extends through both said first and second sensing coils.

8. The trip unit of claim 7 wherein said second coil has a secondary winding, wherein said sputtering arc detection circuit comprises means connected to said secondary winding generating a bandwidth limited di/dt signal where i is current in said neutral conductor, and means responsive to said di/dt signal to generate said trip signal under preselected conditions, and wherein said test means further comprises means injecting test signals into said secondary winding which cause said sputtering arc detector circuit to generate said trip signal.

9. A trip unit for a circuit breaker in a protected electrical system having a line conductor and a neutral conductor and subject to sputtering arc faults and ground faults, comprising:

sensing coil means sensing currents in said protected electrical system, fault detector means connected to the sensing coil means for generating a trip signal in response to ground faults including grounded neutral faults and to sputtering arc faults, test means connected to said sensing coil means selectively injecting signals simulating grounded neutral and sputtering arc fault conditions into said fault detector means, said test means comprising a test conductor extending through said sensing coil means, a test switch for selectively connecting said test conductor in a closed loop extending through said sensing coil means, said test conductor having an impedance substantially equivalent to a maximum impedance of a grounded neutral fault in said protected electrical system, said sensing coil means comprising a first sensing coil through which both said line conductor and said neutral conductor pass and a second sensing coil through which said neutral conductor but not said line conductor passes, wherein said fault detection means comprises a dormant oscillator ground fault detector circuit connected to said first and second sensing coils and a sputtering arc detector circuit connected to said second sensing coil, wherein said test conductor means extends through both said first and second sensing coils, said second coil having a secondary winding, wherein said sputtering arc detection circuit comprises means connected to said secondary winding generating a bandwidth limited di/dt signal where i is current in said neutral conductor, and means responsive to said di/dt signal to generate said trip signal under preselected conditions, wherein said test means further comprises means injecting test signals into said secondary winding which cause said sputtering arc detector circuit to generate said trip signal.

10. The trip unit of claim 9 wherein said means injecting test signals comprises an impedance means connected to said secondary winding and a switch selectively connecting said impedance means to said line conductor.

11. The trip unit of claim 9 wherein said means injecting test signals comprises a capacitor connected to said secondary winding, means charging said capacitor, and switch means selectively discharging said capacitor into said secondary winding.

12. The trip unit of claim 9 wherein said means responsive to said di/dt signal comprises level detector means comparing said di/dt signal to a threshold, and means responsive to said level detector generating a trip signal when said di/dt signal exceeds said threshold a predetermined number of times in a selected interval, and wherein said means injecting test signals into said secondary winding injects test signals in said secondary winding which exceed said threshold said predetermined number of times in said selected interval.

13. The trip unit of claim 12 wherein said means injecting test signals comprises impedance means connected to said secondary winding, and a switch selectively connecting said impedance means to said line conductor to inject AC pulses into said secondary winding.

14. The trip unit of claim 12 wherein said test means comprises a capacitor connected to said secondary winding, means charging said capacitor, and switch means selectively discharging said capacitor into said secondary winding to generate an oscillation.

15. A self testing trip unit for a circuit breaker in a protected electrical system having a line conductor and a neutral conductor and subject to sputtering arc faults, said trip unit comprising: a sensing coil having one of said line and neutral conductors as a primary winding and having a secondary winding; means connected to said secondary winding generating a bandwidth limited di/dt signal where i is current in said protected electrical system; level detector means comparing said bandwidth limited di/dt signal to a selected threshold; means generating a trip signal when said bandwidth limited di/dt signal exceeds said selected threshold a predetermined number of times in a selected interval; and test means connected to said sensing coil for generating pulses which produce a bandwidth limited di/dt signal which exceeds said selected threshold said predetermined number of times within said selected interval.

16. The serf testing trip unit of claim 15 wherein said test means comprises impedance means connected to said secondary winding, and switch means selectively connecting said impedance means to said line conductor.

17. The serf testing trip unit of claim 15 wherein said test means comprises a capacitor connected to said secondary winding, means charging said capacitor, and switch means selectively discharging the capacitor into said secondary winding to produce an oscillation.

18. A trip unit for a circuit breaker in a protected ac electrical system having a line conductor and a neutral conductor, said trip unit comprising:

sensing means, sensing current in said protected electrical system, fault detection means connected to said sensing means and including means generating a trip signal in response to current patterns produced by sputtering arc faults in said protected electrical system, and test means coupled to said sensing means simulating said current patterns produced by sputtering arc faults to generate said trip signal.

19. The trip unit of claim 18 wherein said fault detector means comprises means responsive to a current pattern in which said current exceeds a preselected magnitude a predetermined number of times within a selected interval of time, and wherein said test means comprises means generating a test signal which exceeds said preselected magnitude said predetermined number of times within said selected interval of time.

20. The trip unit of claim 19 wherein said sensing means comprises sensing coil means through which said neutral conductor passes and said test means comprises test conductor means extending through said sensing coil means, and a test switch for selectively connecting said test conductor means in a closed loop which passes through said sensing coil means.

21. The trip unit of claim 19 wherein said sensing means comprises a lead connected to said neutral conductor and to a low pass filter followed by a high pass filter, and wherein said test means comprises an impedance and a switch which when selectively closed connects said impedance across the line conductor and neutral conductor, said impedance being connected to said low pass filter.

22. A trip unit for a circuit breaker in a protected ac electrical system having a line conductor and a neutral conductor, comprising:

sensing means, sensing current in said protected electrical system, fault detection means connected to said sensing means and including means generating a trip signal in response to current patterns produced by sputtering arc faults in said protected electrical system, test means coupled to said sensing means simulating said current patterns produced by sputtering arc faults to generate said trip signal, said fault detector means comprising means responsive to a current pattern in which said current exceeds a preselected magnitude a predetermined number of times within a selected interval of time, wherein said test means comprises means generating a test signal which exceeds said preselected magnitude said predetermined number of times within said selected interval of time, said sensing means comprising a lead connected to said neutral conductor and to a low pass filter followed by a high pass filter, wherein said test means comprises an impedance and a switch which when selectively closed connects said impedance across the line conductor and neutral conductor, said impedance being connected to said low pass filter.

23. The trip unit of claim 22 wherein said low pass filter comprises a resistor and capacitor, and said impedance and said resistor form a voltage divider which produces said test signal.

* * * * *